United States Patent [19]

Takashima

[11] Patent Number: 5,091,822

[45] Date of Patent: Feb. 25, 1992

[54] RADIAL TYPE OF PARALLEL SYSTEM BUS STRUCTURE WITH PRINTED, TWISTED CONDUCTOR LINES

[75] Inventor: Tokuhei Takashima, Tokyo, Japan

[73] Assignee: Graphico Co., Ltd., Tokyo, Japan

[21] Appl. No.: 535,487

[22] Filed: Jun. 11, 1990

[30] Foreign Application Priority Data

Jun. 15, 1989 [JP] Japan ................................. 1-152985

[51] Int. Cl.⁵ .......................... H05K 7/20; H05K 7/10; H05K 1/11; H01L 23/02
[52] U.S. Cl. ..................................... 361/384; 361/398; 361/407; 361/409; 361/412; 357/81
[58] Field of Search ............... 361/384, 396, 398, 406, 361/407, 408, 409, 410, 412, 414; 357/81

[56] References Cited

U.S. PATENT DOCUMENTS

| | | | |
|---|---|---|---|
| 4,386,651 | 6/1983 | Reinhard | 165/104.33 |
| 4,697,858 | 10/1987 | Balakrishnan | 439/61 |
| 4,734,825 | 3/1988 | Peterson | 361/414 |
| 4,801,996 | 1/1989 | Knotts | 357/68 |

Primary Examiner—Gerald P. Tolin
Assistant Examiner—Young S. Whang

[57] ABSTRACT

A radial type of parallel system bus structure used bus wire-printed disks each having printed signal conductors of equal length extending radially from a common contact center. Each printed signal conductor comprises two twisted conductor lines, and each conductor line consists of many segments disposed alternately on opposite surfaces of the disk, the successive segments of each line being connected by plating in through-holes in the disk. The radial arrangement of signal conductors permits connection of selected CPU boards via equal length of signal path. Also, the use of twisted conductor lines improves the signal transmission characteristics of the bus in high-frequency ranges.

20 Claims, 6 Drawing Sheets

RADIAL TYPE OF PARALLEL SYSTEM BUS STRUCTURE WITH PRINTED, TWISTED CONDUCTOR LINES

BACKGROUND OF THE INVENTION

1. Field of the invention

The present invention relates to an exterior bus for a microprocessor computer.

2. Description of the prior art

A conventional hardwear structure of multi-microcomputer system uses a plurality of CPU boards each having a central processing unit built thereon, and these CPU boards are mounted in a frame with their main surfaces parallel with each other. The lead conductors which are terminated at the inside edge of each CPU board, are connected to a bus cable extending behind the frame via an appropriate connector.

In the conventional multi-microcomputer system a plurality of CPU boards are arranged with their main surfaces parallel with each other to form a single line, and these CPU boards are connected to a single bus cable. As a consequence, the distance between two CPU boards selected among a series of boards may depend on which positions such CPU boards are located, varying greatly with the increase of the number of the series-connected boards. In case of communication between selected CPU boards via the bus cable, the signal path whose length is dependent on which boards are selected, must be taken into consideration for well-timed operation.

Also, disadvantageously the transmission loss due to the stray capacitance of the bus cable will increase with the increase of signal frequency.

Figure 9:
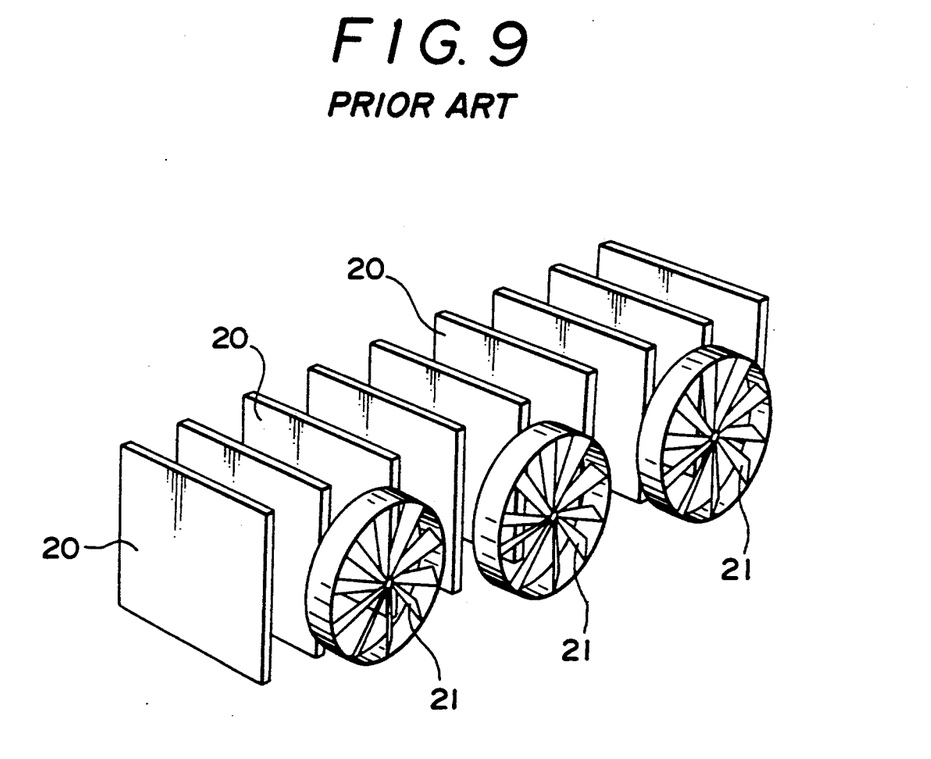
FIG. 9 is a perspective view of a conventional arrangement of CPU boards standing upright and arranged side by side.

As shown in FIG. 9, a plurality of air conditioning fans 21 are arranged along the line of CPU boards 20. CPU boards which are positioned near each fan will be cooled more than those which are positioned far from each fan, and therefore, it is difficult that all CPU boards are cooled evenly and kept at same temperature.

SUMMARY OF THE INVENTION

One object of the present invention is to provide an improved parallel system bus structure which permits inter-board signal path to be equal and as short as possible, regardless of the number of CPU boards used, thereby simplifying the controlling of signal transmission, and increasing the inter-CPU board communication speed to possible maximum.

Another object of the present invention is to provide an improved parallel system bus structure which permits even cooling of all CPU boards used, thereby keeping them at a given constant temperature.

Still another object of the present invention is to provide an improved parallel system bus structure which has a decreased stray capacitance between bus conductor lines, accordingly improving transmission characteristics in high-frequency range.

In order to attain these objects an improved parallel system bus structure according to the present invention is designed to permit radial arrangement of CPU boards standing upright around a pile of dielectric disks and converging towards a common center with their lead conductors connected to selected common contacts of the dielectric disks via twisted signal wires of equal radial length printed on the dielectric disks.

According to the first aspect of the present invention a radial type of parallel system bus structure comprises: a plurality of bus wire-printed boards which are spaced and arranged vertically along one axial line, each board having a plurality of printed signal conductors of equal length extending radially from a common contact center, each printed signal conductor comprising two twisted conductor lines each consisting of a plurality of segments disposed alternately on opposite surfaces of the board, the successive segments of each line being connected by electrically conductive means passing through -holes in the board; and a plurality of stationary connectors each being connected to selected signal conductors and being adapted to mate with the edge connector of a CPU board, and said stationary connectors being arranged around said bus wire printed boards, whereby said structure permits connection between selected signal conductors on each bus wire-printed board and selected terminals on each of a plurality of CPU boards, which stand upright around bus wire-printed boards.

According to the second aspect of the present invention a radial type of parallel system bus structure comprises at least one bus wire-printed board which is composed of a plurality of layers each having a plurality of printed signal conductors and a common contact center connected thereto.

According to the third aspect of the present invention one of two twisted conductor lines each of all or selected printed signal conductors is grounded and used as ground wire.

According to the fourth aspect of the present invention a radial type of parallel system bus structure comprises at least one air conditioning fan above or below the vertical arrangement of said bus wire-printed boards on its central axis.

Inter-CPU board communication will be performed via a group of radial signal conductors on every bus-printed board, which radial signal conductors are connected to the lead conductors of each CPU board. In a parallel system bus structure according to the first aspect of the present invention all CPU boards are electrically connected to each other by selected two radial signal conductors of equal length. In a parallel system bus structure according to the second aspect of the present invention signal conductors are provided at an increased density. In a parallel system bus structure according to the third aspect of the present invention the signal conductors are shielded. Finally, in a parallel system bus structure according to the fourth aspect of the present invention all CPU boards will be evenly cooled and kept at an equal temperature.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Other objects and advantages of the present invention will be understood from the following description of preferred embodiments, which are shown in accompanying drawings given by way of illustration only, and thus are not limitative of the present invention, and wherein.

DESCRIPTION OF PREFERRED EMBODIMENTS

As regards external buses which are designed for use in micro-processor computer systems, every manufacturing company established standards according to which they make external buses.

Preferred embodiments of the present invention will be described as being applied to a Parallel System Bus manufactured by Intel Corp.

Figure 2:
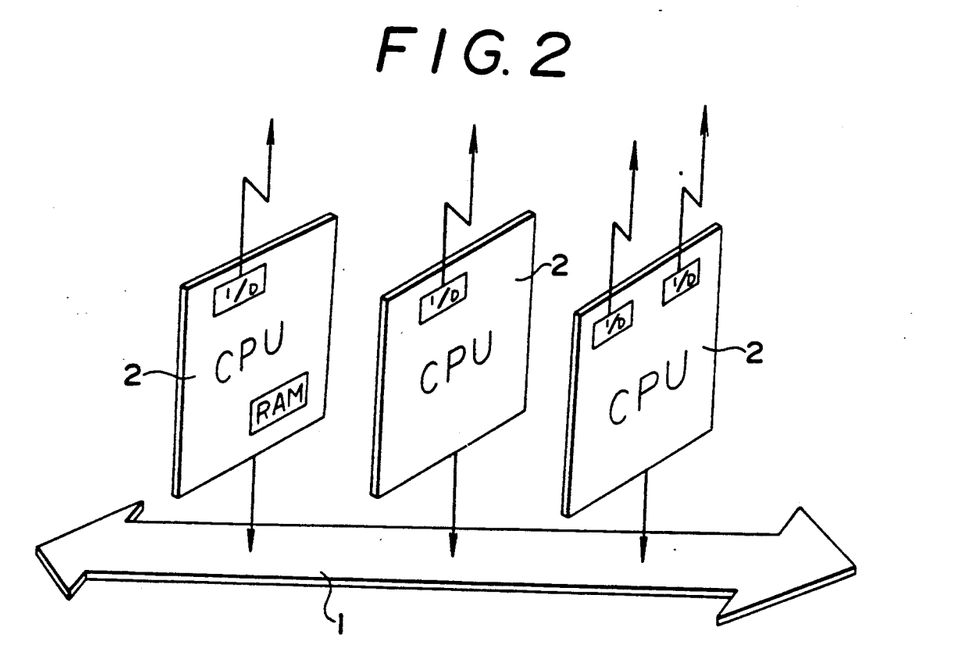
FIG. 2 is a schematic diagram showing a series-arrangement of CPU boards connected via a parallel system bus in a multi-microprocessor system.

Such a multi-bus was designed for use in a multi-microprocessor system having a plurality of microprocessors 2 built therein. As seen from FIG. 2, these microprocessors 2 are connected to each other by a Parallel System Bus 1.

Figure 3:
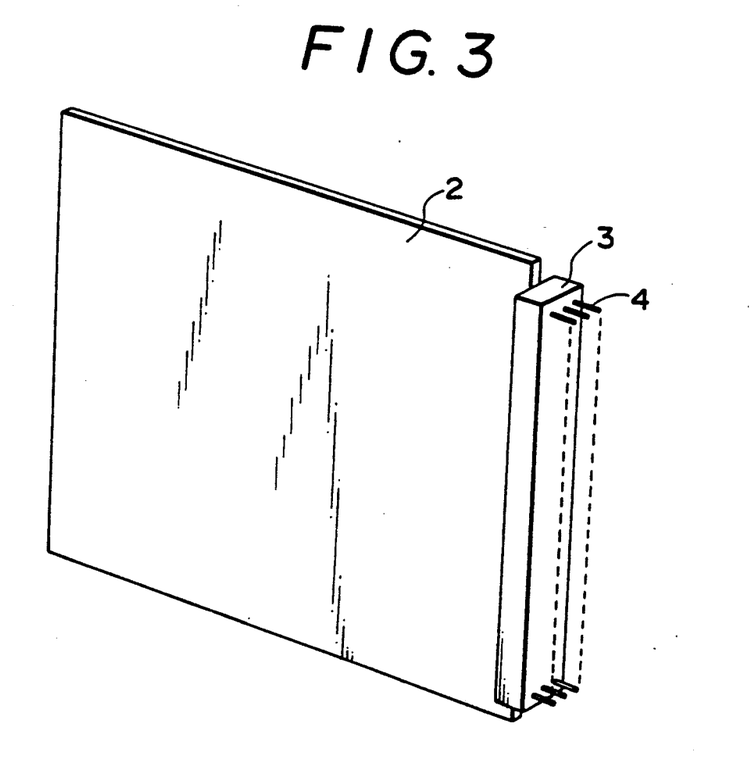
FIG. 3 is a perspective view of a CPU board.

There are two kinds of CPU boards to be used in such a multi-microprocessor system, i.e., one ("Single-High Board") equipped with a single board connector 3 on its terminal edge (See FIG. 3), and the other ("Double-High Board") equipped with two board connectors vertically on its terminal edge.

A board connector 3 has 32 connector pins 4 each arranged in three lines (96 connector pins in total).

Figure 4:
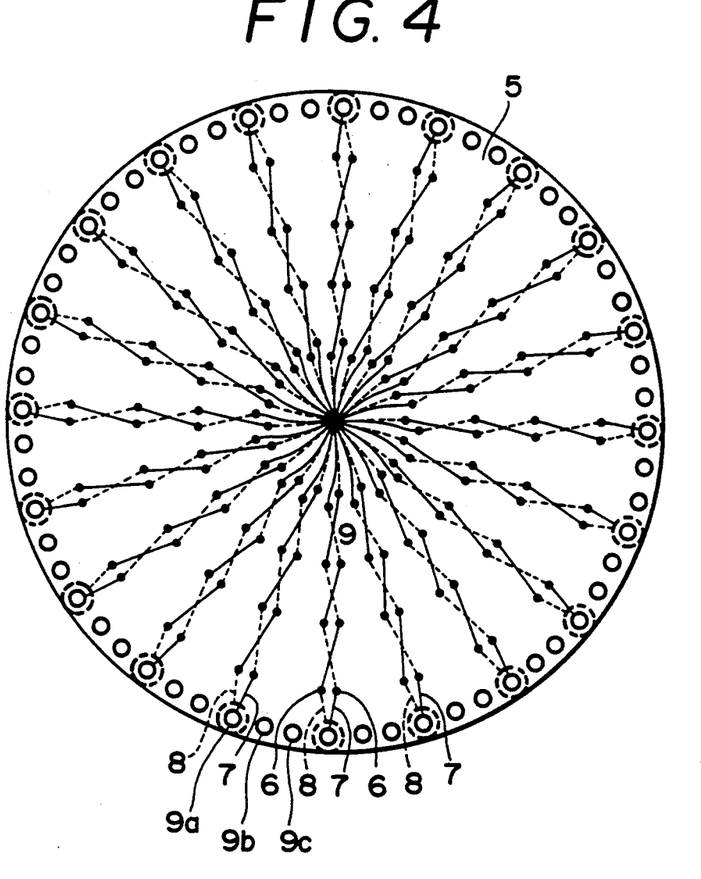
FIG. 4 is a plane view showing the radial arrangement of signal conductors printed on a selected layer of multi-layer bus-printed board.
Figure 5:
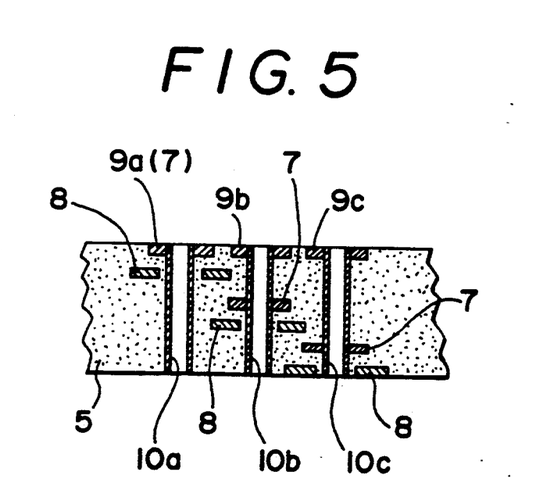
FIG. 5 is a sectional view of a bus-printed board, showing signal and ground conductors in layers at different levels.

FIG. 4 shows a three-layer bus wire-printed board of epoxy resin 5, which has twenty printed signal conductors of equal length extending radially from a common contact center 9 in each of the three-layers separated by an insulation thickness. Each printed signal conductor comprises two twisted conductor lines. In FIG. 4 signal conductor patterns appearing on opposite surfaces of the uppermost layer are shown solid line 7 (upper surface) and broken line 8 (lower surface). As seen from the drawing, each conductor line consists of a plurality of segments disposed alternately on opposite surfaces of the layer. The successive segments of each conductor line are electrically connected by electrodeless plating of through-holes 6 of the layer, thereby making up a printed conductor of two twisted conductor lines. One of these conductor lines is used as signal conductor line 7 whereas the other conductor line is used as ground line 8. The bus wire-printed layers are spaced by an intervening insulation thickness, and they are integrated in the form of multi-layer board 5. The printed signal conductors on each layer are positioned offset relative to the printed signal conductors on the other layers, so that the printed signal conductors may not be put in registration vertically. The signal conductor lines 7 of the uppermost layer are connected to terminals 9a; the signal conductor lines 7 of the intermediate layer are connected to terminals 9b and the signal conductor lines 7 of the lowermost layer are connected to terminals 9c. The ground conductor lines 8 of all the layers are connected to ground terminals in common. As best shown in FIG. 5, the terminals 9a, 9b and 9c are connected to upper, intermediate and lower signal conductor line ends 7 by electrodeless platings in through-holes 10a, 10b and 10c, respectively. Each bus-printed board has 20×3 pin holes for the signal conductors in three layers. Three pin holes 10a, 10b and 10c make up a single set (See FIG. 5).

Figure 6:
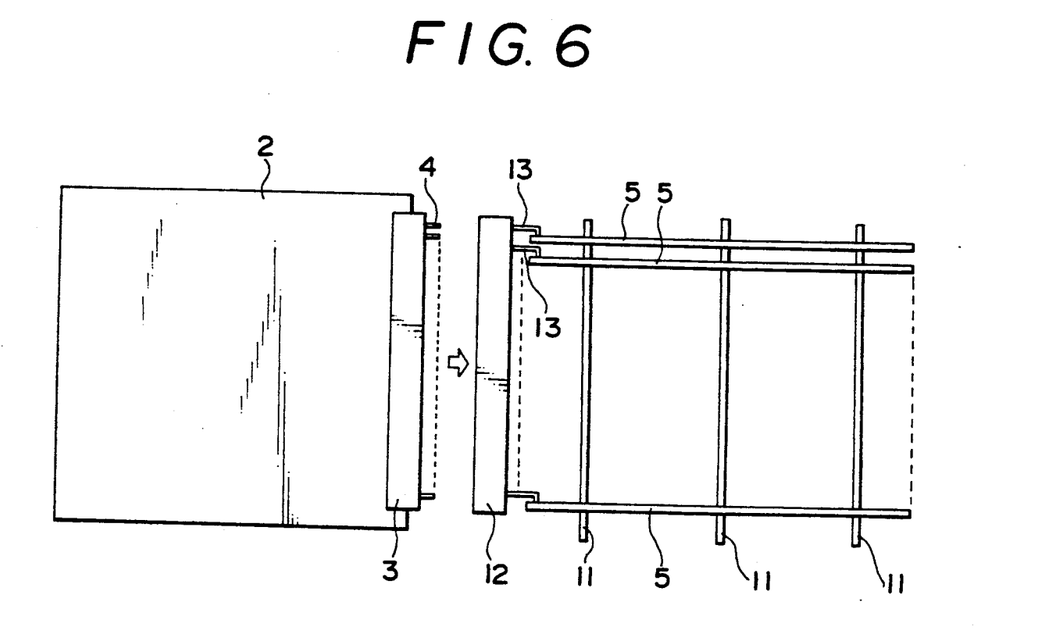
FIG. 6 is a side view of a vertical stack of bus-printed boards and a CPU board, which are to be connected together.
Figure 7:
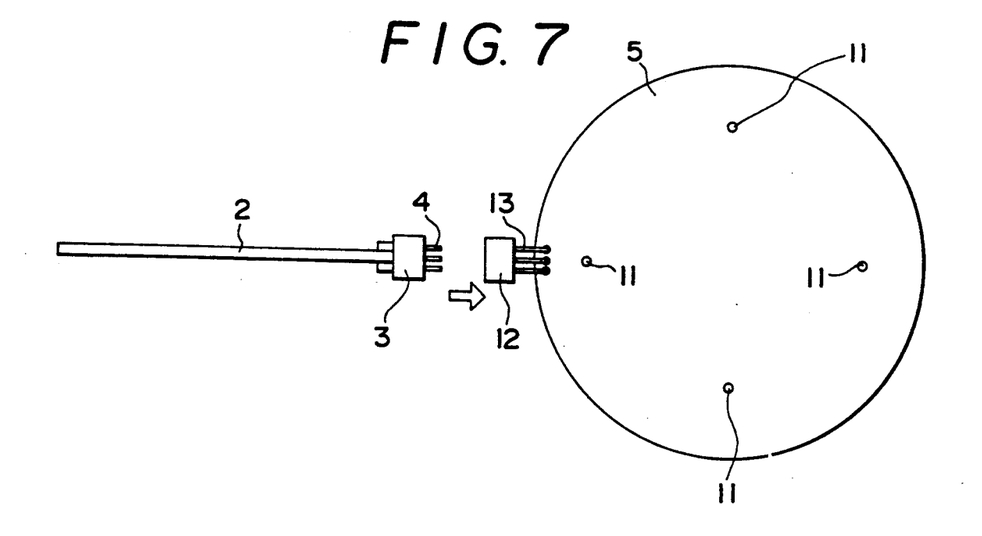
FIG. 7 is a plane view of the stack of bus-printed boards and the CPU board.

In use, twelve bus-printed boards 5 are arranged vertically at regular spaces on four support rods 11, which stand on a frame (not shown). Stationary connectors 12 are fixed to the frame, and all terminals of each stationary connector 12 are connected to the pin holes with the aid of L-shaped metals 13. CPU boards 2 standing upright are connected to the bus-printed boards 5 with their connector pins 4 inserted in the pin holes of the stationary connector 12. Then, each set of three pin holes 10a, 10b and 10c receive three pins 4 at same level (See FIGS. 6 and 7). Each CPU board 2 is held by slidably inserting its upper and lower edges in upper and lower guide slots of the frame (not shown).

Figure 1:
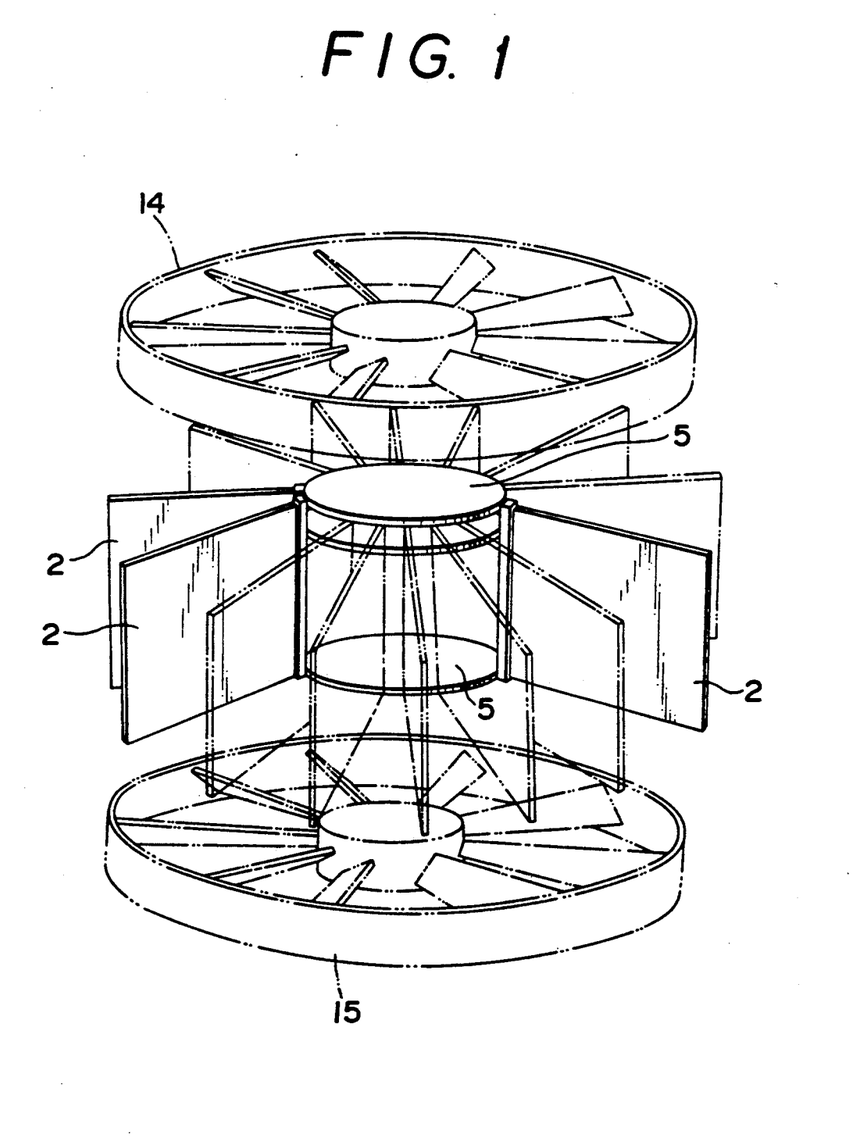
FIG. 1 is a perspective view of a radial type of parallel system bus structure according to one embodiment of the present invention.

As seen from FIG. 1, a desired number of CPU boards 2 are arranged radially on the circumferences of twelve bus-printed disks 5. Air-conditioning fans 14 and 15 are put above and below the bus-printed disk column.

The standard distance between adjacent CPU boards when connected to a conventional Parallel System Bus is 0.8 inches (20.32 mm). A longest data bus commercially available is 16.8 inches long. Therefore, twenty CPU boards can be connected to such data bus at standard intervals of 0.8 inches, and if CPU boards of "board-add-on" type (in which type a CPU board has a small board added thereon) are used, fewer CPU boards are permitted. In contrast, twenty CPU boards of "board-add-on" type can be connected to the circumference of a bus disk having spoke-like conductors printed thereon according to the present invention because these CPU boards are arranged at regular angular intervals, leaving a divergent space between adjacent CPU boards, which divergent space is large enough to accommodate the extra small board.

Figure 8:
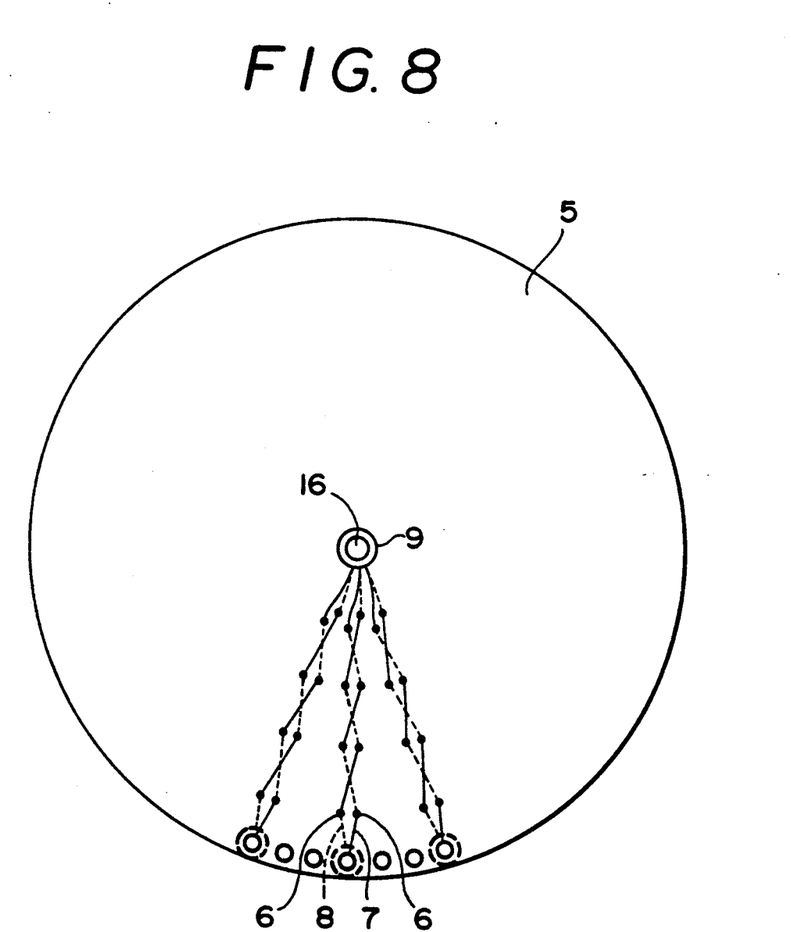
FIG. 8 is a plane view of the bus disk used in a radial type of parallel system bus structure according to another embodiment of the present invention, showing radial arrangements of twisted signal and ground conductors.

FIG. 8 shows another pattern of signal conductor lines 7 and ground conductor lines 8. As shown, each common center contact 9 is a small ring whose aperture 16 permits insertion of a support rod to hold a bus-printed disk 5.

In this particular embodiment the signal path between selected CPU boards cannot be exactly the same, but can be substantially twice as long as radial signal conductor, that is, the diameter of the disk.

As may be understood from the above, the radial arrangement of signal conductors in a parallel system bus according to the present invention permits connection of selected CPU boards via equal length of signal path, no matter how many CPU boards may be used. Therefore, no timed control is required in transmission of signals between selected CPU boards via the bus, and accordingly communication speed will be increased to meet highly functional computer's requirements.

Signal conductors can be printed on a relatively small disk at an increased density. Accordingly, the space occupied by the bus may be reduced.

The use of one of two twisted conductor lines as ground conductor is effective to reduce the stray capacitance of the bus to possible minimum, thereby improving the signal transmission characteristics of the bus in high frequency ranges. Also, such use is effective to provide an electromagnetic shield, preventing the cross talk which otherwise would appear between bus lines, and suppressing the noise effect on the bus lines.

Air-conditioning fans below and/or above the bus disk column permit even cooling of the CPU boards surrounding the bus disk column to keep them at equal temperature.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. Radial type of parallel system bus structure comprising:
   a plurality of bus wire-printed boards which are spaced and arranged vertically along a center axis, each board having a plurality of printed signal conductors of generally equal length extending radially from a common contact center, each printed signal conductor comprising two twisted conductor lines each consisting of a plurality of successive segments disposed alternately at opposed positions of the board, adjacent printed signal conductors on each board having the conductor lines thereof imbricated with adjacent conductor lines such that the printed signal conductors can be closely spaced together;
   means for electrically connecting the successive segments of each line, the means for connecting passing through through-holes in the board; and
   a plurality of stationary connectors each being connected to selected signal conductors and being adapted to mate with an edge connector of a CPU board, and said stationary conductors being arranged around said bus wire printed boards;
   whereby said structure permits connection between selected signal conductors on each bus wire-printed board and selected terminals on each of a plurality of CPU boards standing upright around the bus wire-printed boards.

2. The radial type of parallel system bus structure according to claim 1, wherein at least one bus wire-printed board is composed of a plurality of layers each having a plurality of printed signal conductors and a common contact center connected to the plurality of printed signal conductors.

3. The radial type of parallel system bus structure according to claim 1 or 2, wherein one of two twisted conductor lines of each of the printed signal conductors is grounded and used as a ground wire.

4. The radial type of parallel system bus structure according to claim 1, further comprising at least one air conditioning fan positioned above the vertical arrangement of said bus wire-printed boards, the fan being generally centered on the center axis.

5. The radial type of parallel system bus structure according to claim 1 or 2, wherein one of two twisted conductor lines of selected printed signal conductors is grounded and used as a ground wire.

6. The radial type of parallel system bus structure according to claim 1, further comprising at least one air conditioning fan positioned above the vertical arrangement of said bus wire-printed boards, the fan being generally centered on the center axis.

7. The radial type of parallel system bus structure according to claim 1, further comprising means for maintaining a generally constant temperature at the vertical arrangement of said bus wire-printed boards.

8. The radial type of parallel system bus structure according to claim 7, wherein the means for maintaining comprises at least one fan positioned at a location adjacent the vertical arrangement of said bus wire-printed boards such that said at least one fan evenly cools the boards to maintain the generally constant temperature.

9. The radial type of parallel system bus structure according to claim 8, wherein two fans are used as the means for maintaining, one of the fans being positioned above and the other of the fans being positioned below the vertical arrangement of said bus wire-printed boards, each of the fans being generally centered on the center axis.

10. The radial type of parallel system bus structure according to claim 8, wherein one fan positioned above the vertical arrangement of said bus wire-printed boards is used as the means for maintaining, the fan being generally centered on the center axis.

11. The radial type of parallel system bus structure according to claim 8, wherein one fan positioned below the vertical arrangement of said bus wire-printed boards is used as the means for maintaining, the fan being generally centered on the center axis.

12. The radial type of parallel system bus structure according to claim 1, wherein each board has a plurality of layers of printed signal conductors with each layer having a plurality of pair of twisted conductor lines and wherein the plurality of boards are generally vertically aligned with predetermined spacing between each board.

13. The radial type of parallel system bus structure according to claim 12, wherein the plurality of layers of printed signal conductors in each board are aligned in generally parallel planes in the board and the planes of each board are generally parallel aligned to one another.

14. The radial type of parallel system bus structure according to claim 12, wherein each board has three layers of printed signal conductors and wherein the stationary connectors are connected to one of the signal conductors in each of the layers in each of the boards.

15. The radial type of parallel system bus structure according to claim 14, wherein each layer of printed signal conductors in each board has twenty pairs of twisted conductor lines.

16. The radial type of parallel system bus structure as recited in claim 15, wherein each board has an upper surface and a lower surface, and wherein the opposed positions of the successive segments are positioned closer to one of the upper and lower surfaces of the board whereby a first segment of a first line is positioned closer to the upper surface of the board than a first segment of a second line and whereby a second segment of the first line is positioned further from the upper surface of the board than a second segment of the second line, the first and second segments of the first line being electrically connected by the means for connecting and the first and second segments of the second line being electrically connected by the means for connecting.

17. The radial type of parallel system bus structure as recited in claim 16, wherein five segments of each line are provided between the common contact center and the contact with the stationary connectors.

18. The radial type of parallel system bus structure as recited in claim 12, wherein each board has an upper surface and a lower surface, and wherein the opposed positions of the successive segments are positioned closer to one of the upper and lower surfaces of the board whereby a first segment of a first line is positioned closer to the upper surface of the board than first segment of a second line and whereby a second segment of the first line is positioned further from the upper surface of the board than a second segment of the second line, the first and second segments of the first line being electrically connected by the means for connecting and the first and second segments of the second line being electrically connected by the means for connecting.

19. The radial type of parallel system bus structure as recited in claim 1, wherein each board has an upper surface and a lower surface, and wherein the opposed positions of the successive segments are positions closer to one of the upper and lower surfaces of the board whereby a first segment of a first line is positioned closer to the upper surface of the board than a first segment of a second line and whereby a second segment of the first line is positioned further from the upper surface of the board than a second segment of the second line, the first and second segments of the first line being electrically connected by the means for connecting and the first and second segments of the second line being electrically connected by the means for connecting.

20. The radial type of parallel system bus structure as recited in claim 1, wherein the stationary connectors are generally evenly distributed around an outer periphery of each of the bus wire-printed boards and wherein each of the stationary connectors of a bus wire-printed board is connected to the common contact center via one of the printed signal conductors.

* * * * *